(12) United States Patent
Mengel et al.

(10) Patent No.: US 7,955,873 B2
(45) Date of Patent: Jun. 7, 2011

(54) METHOD OF FABRICATING A SEMICONDUCTOR DEVICE

(75) Inventors: Manfred Mengel, Bad Abbach (DE);
Thomas Spoettl, Mintraching (DE);
Frank Pueschner, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 149 days.

(21) Appl. No.: 12/415,757

(22) Filed: Mar. 31, 2009

(65) Prior Publication Data
US 2010/0248475 A1      Sep. 30, 2010

(51) Int. Cl.
*H01L 21/00* (2006.01)
(52) U.S. Cl. .......................................................... 438/4
(58) Field of Classification Search .................. None
See application file for complete search history.

(56) References Cited

U.S. PATENT DOCUMENTS

| 6,132,586 A | * | 10/2000 | Adams et al. | ................ 205/123 |
| 2009/0045418 A1 | * | 2/2009 | Yeh | ................................ 257/91 |

* cited by examiner

*Primary Examiner* — Charles Garber
*Assistant Examiner* — Andre' C Stevenson
(74) *Attorney, Agent, or Firm* — Dicke, Billig & Czaja, PLLC

(57) ABSTRACT

A method of fabricating a semiconductor device is disclosed. In one embodiment, the method includes providing at least one semiconductor chip including an electrically conductive layer. A voltage is applied to an electrode. The electrode is moved over the electrically conductive layer for growing a metal layer onto the electrically conductive layer.

24 Claims, 8 Drawing Sheets

FIG 2
A
B
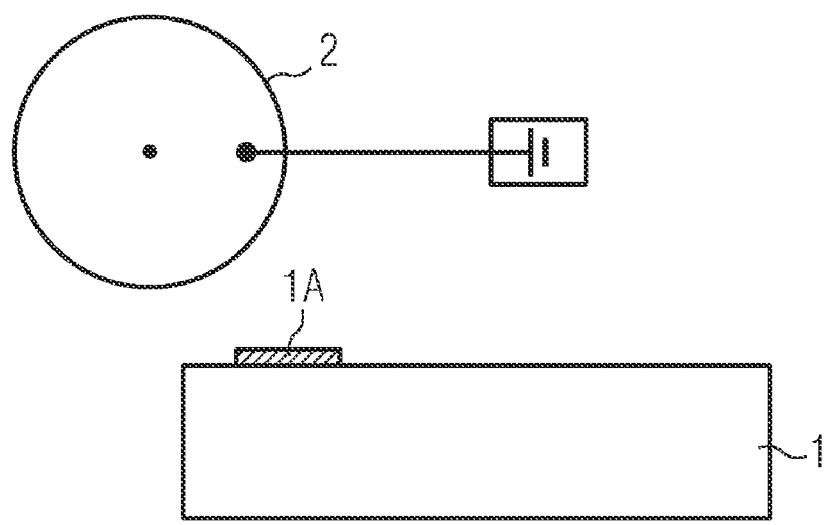
C
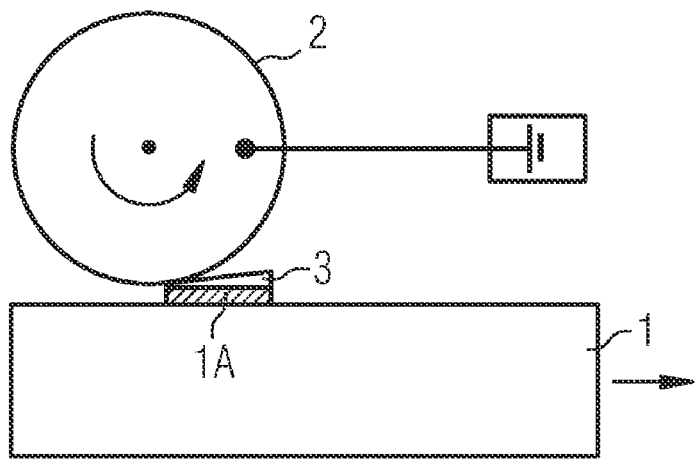

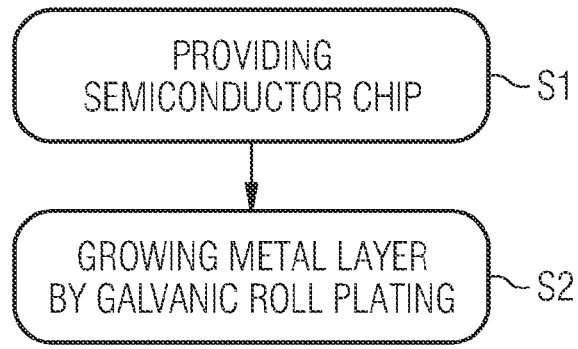
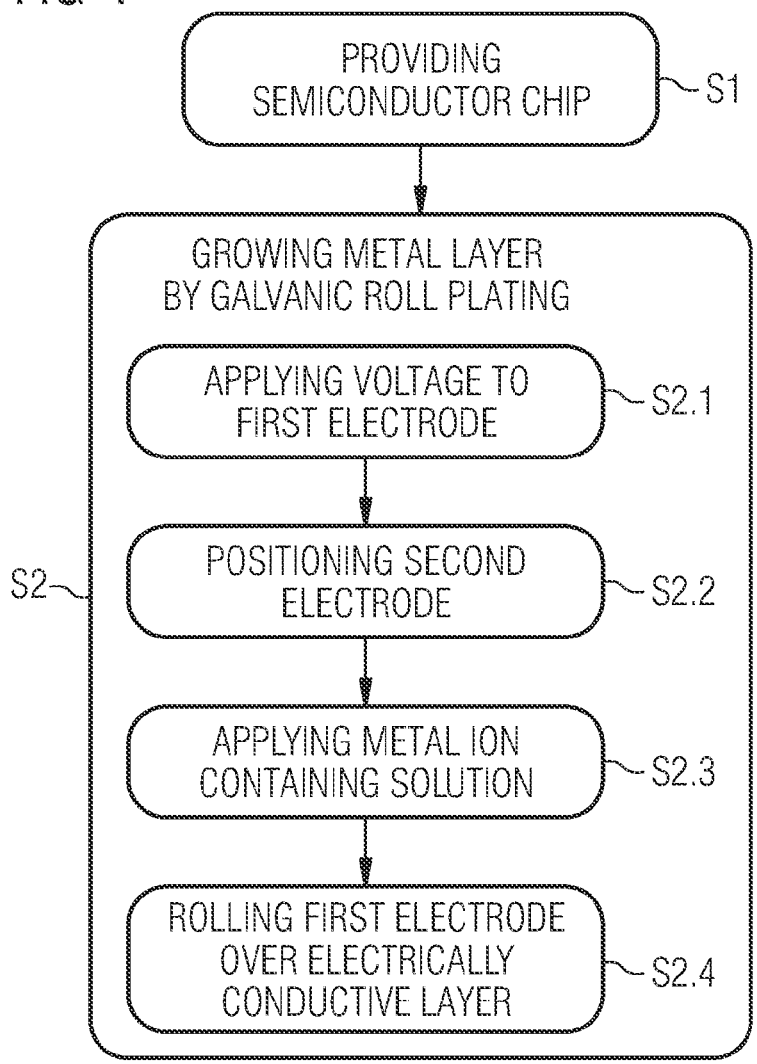

FIG 5
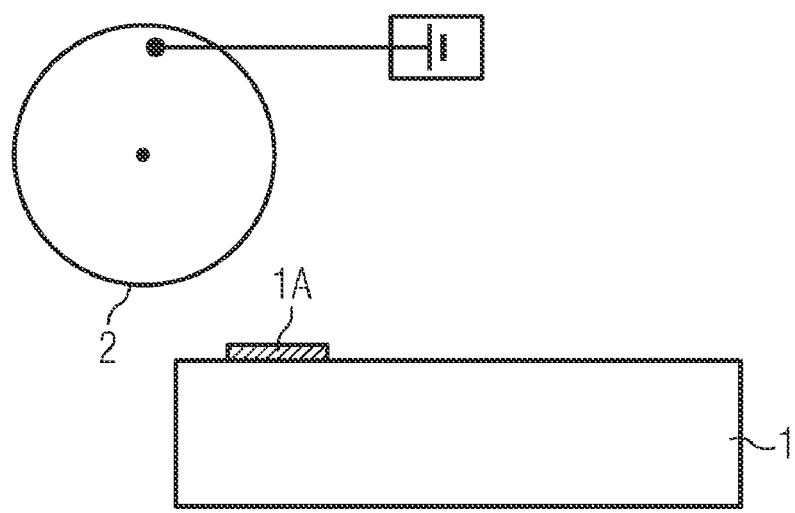
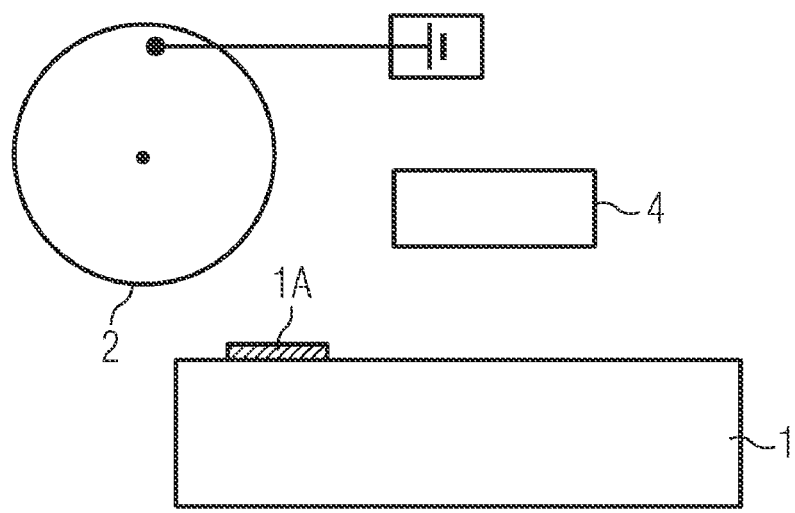

FIG 5
D
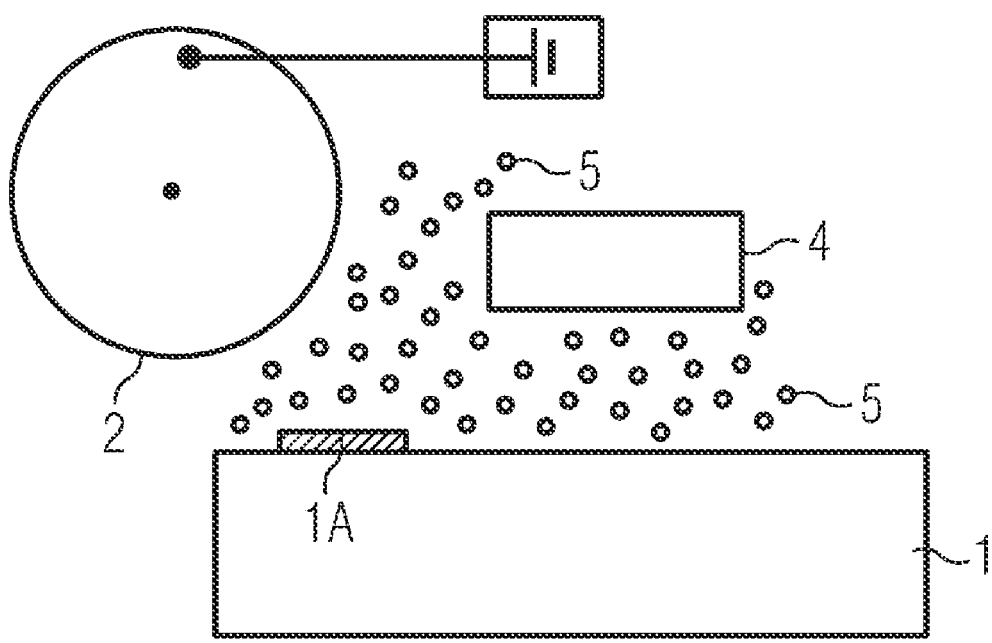
E
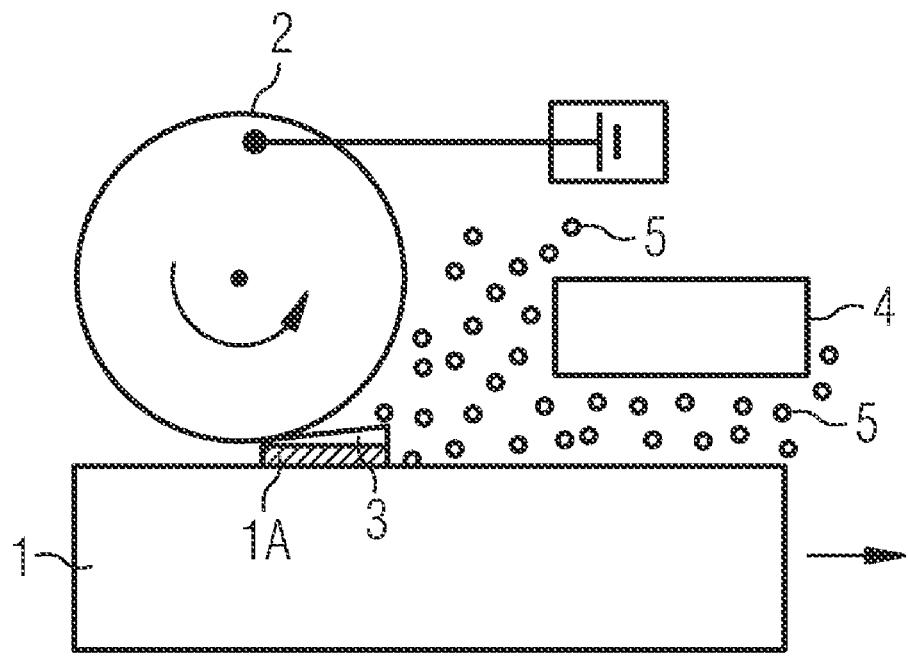

FIG 6
A
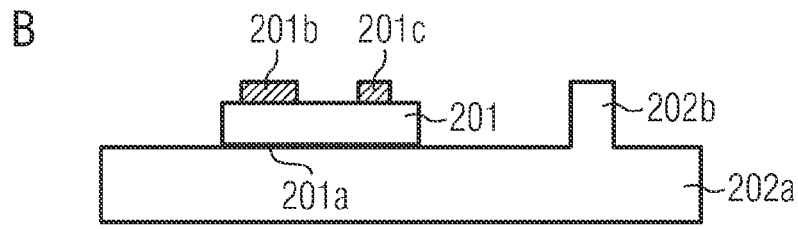
B
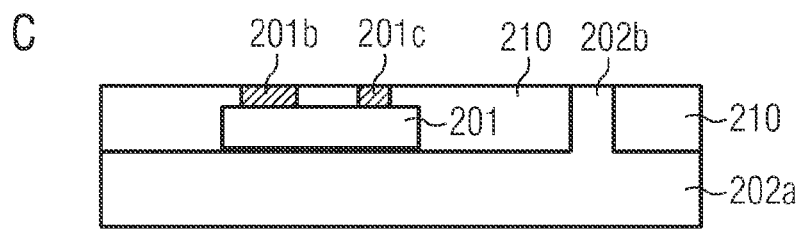
C
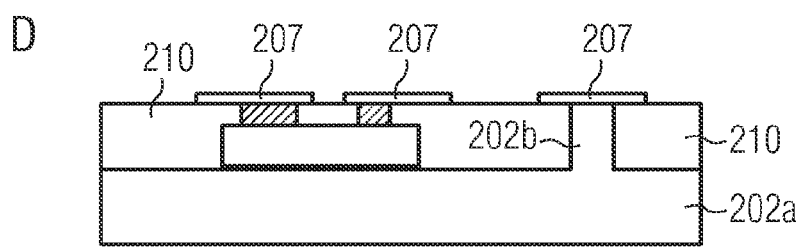
D
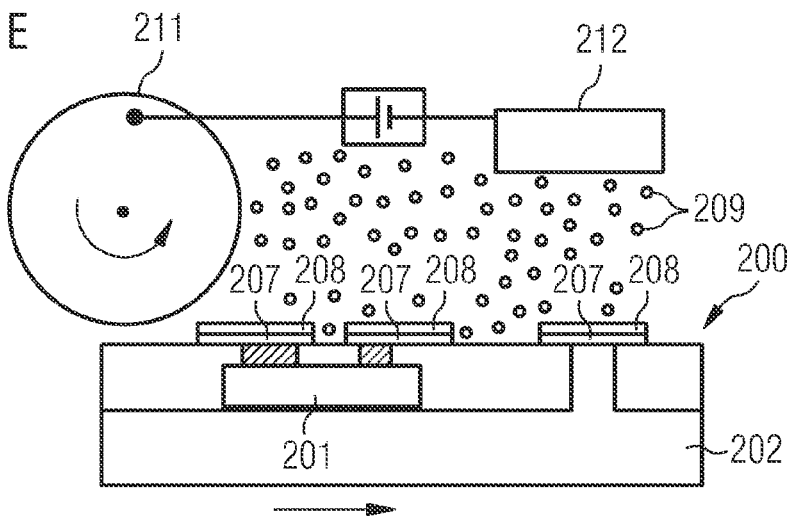
E

FIG 7
A
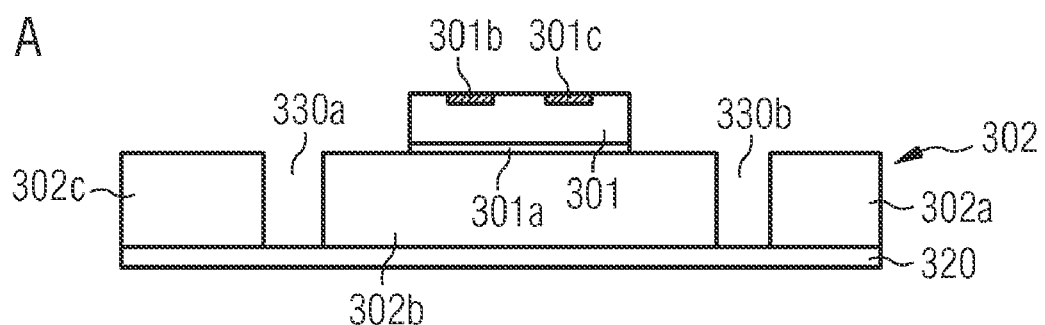
B
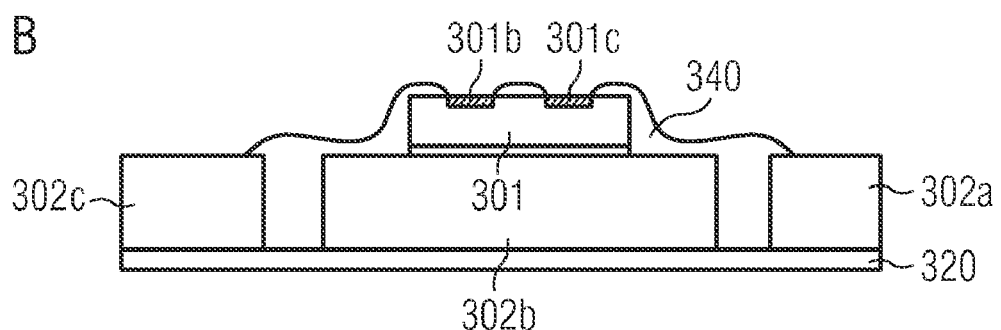
C
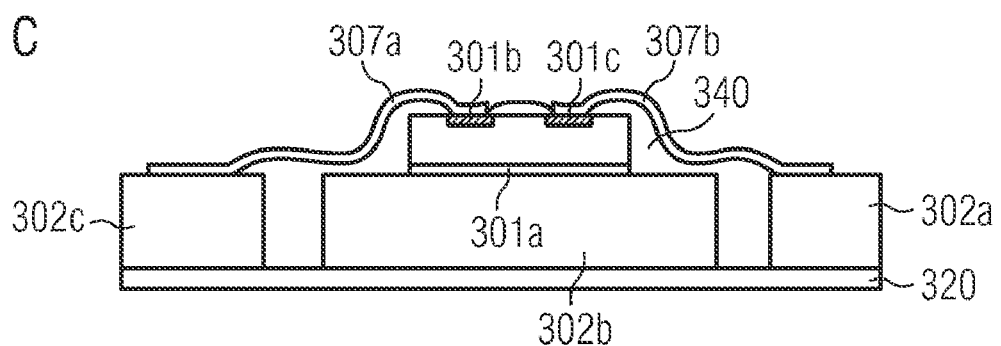
D
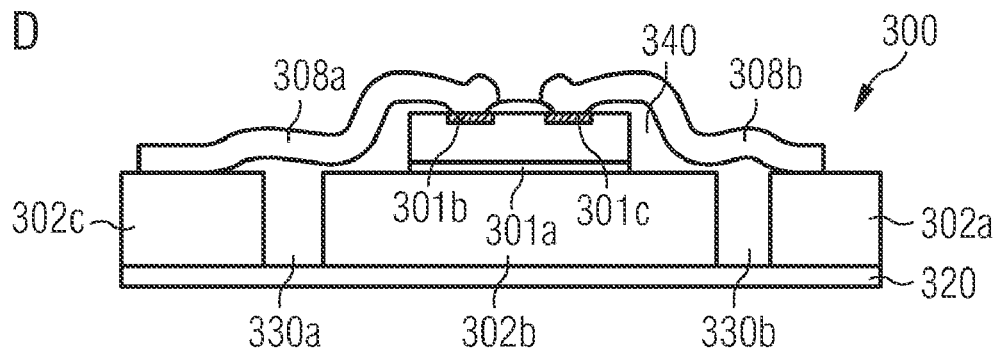

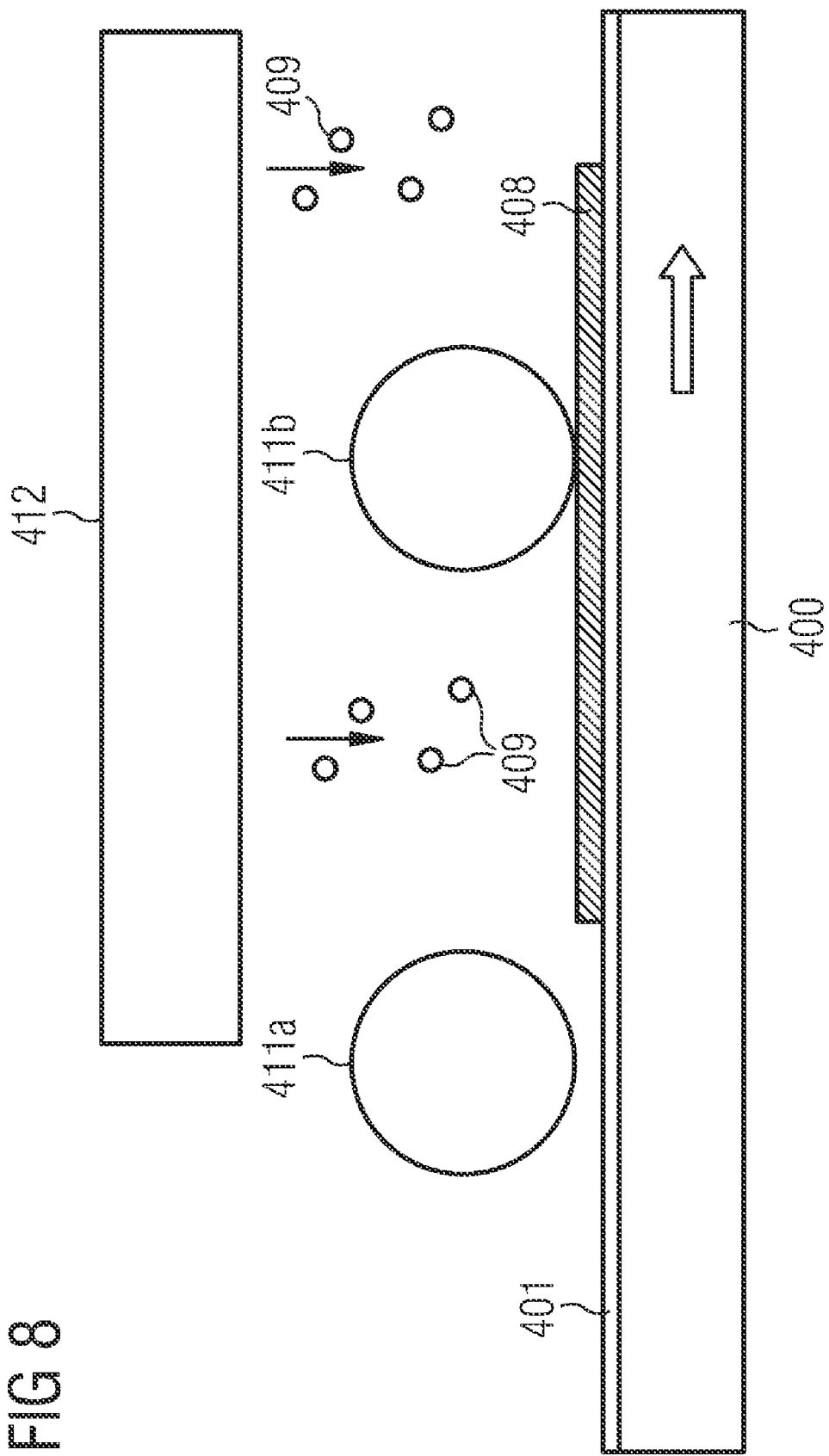

METHOD OF FABRICATING A SEMICONDUCTOR DEVICE

BACKGROUND

The present invention relates to a method of fabricating a semiconductor device.

Structured metallization layers such as conductive paths or circuit interconnections are widely used for signal routing and powering of electronic devices. In many applications, it is desirable to provide for a versatile and cost-effective method to apply structured metallization layers to semiconductor devices or substrates.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2A-C illustrate schematic cross-sectional representations to illustrate one embodiment of a method of fabricating a semiconductor device.

FIG. 3 illustrates a flow diagram of a method of fabricating a semiconductor device according to one embodiment.

FIG. 4 illustrates a flow diagram of a method of fabricating a semiconductor device of one embodiment.

FIGS. 5A-E illustrate schematic cross-sectional representations for illustrating one embodiment of a method of fabricating a semiconductor device.

FIGS. 6A-E illustrate cross-sectional representations for illustrating a method of fabricating a semiconductor device according to one embodiment.

FIGS. 7A-D illustrate schematic cross-sectional representations for illustrating a method of fabricating a semiconductor device according to one embodiment.

FIG. 8 illustrates a schematic cross-sectional representation of a galvanic roll-plating arrangement according one embodiment.

DETAILED DESCRIPTION

Figure 1:
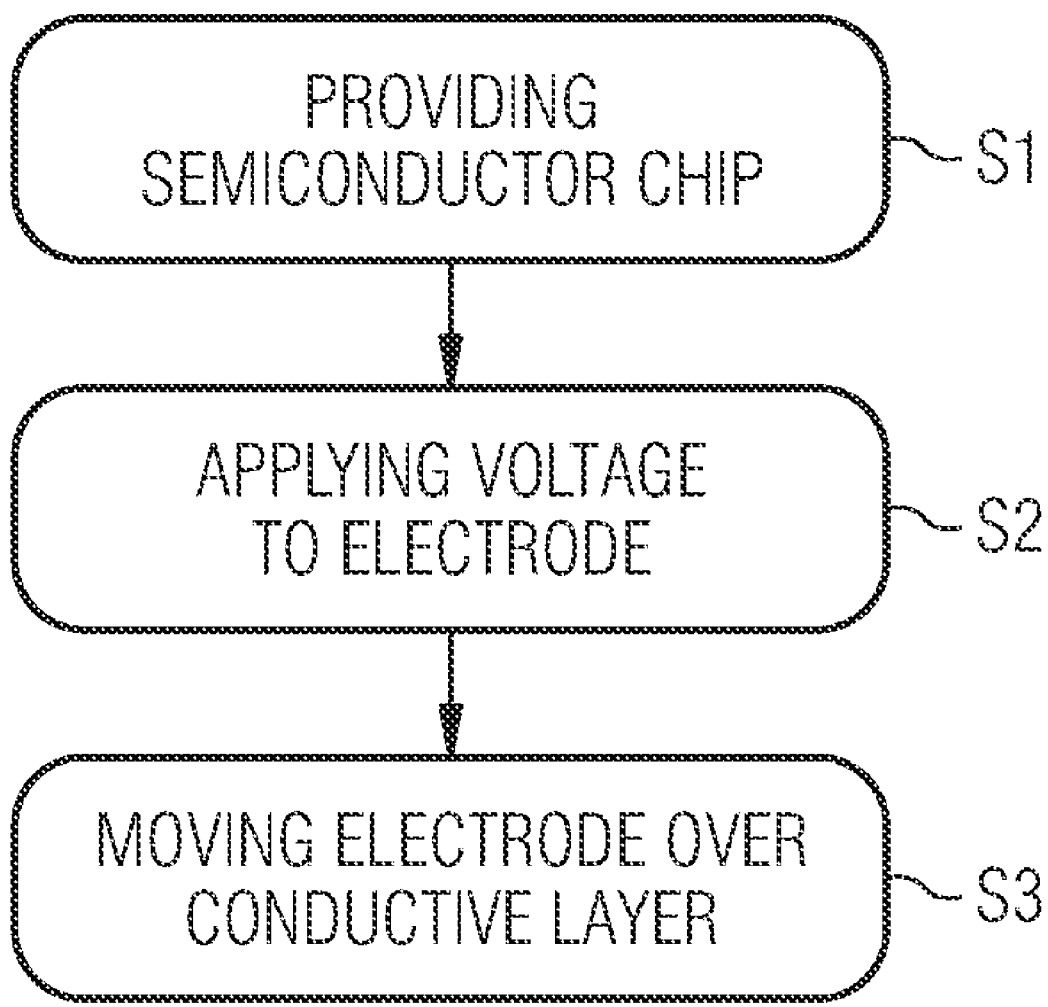
FIG. 1 illustrates a flow diagram of a method of fabricating a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following detailed description, reference is made to the accompanying drawings, which form a part hereof, and in which are shown by way of illustration specific embodiments. In this regard, directional terminology, such as "top", "bottom", "front", "back", "leading", "trailing", etc., is used with reference to the orientation of the figure(s) being described. Because components of embodiments can be positioned in a number of different orientations, the directional terminology is used for purposes of illustration and is in no way limiting. It is to be understood that structural changes may be made within the specific embodiment.

The aspects and embodiments are described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are illustrated in schematic form in order to facilitate describing one or more aspects of the embodiments. It is to be understood that other embodiments may be utilized and structural or logical changes may be made without departing from the scope of the present invention.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Embodiments of manufacturing a semiconductor device may include providing a chip attached to a carrier. The semiconductor chips described herein may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor wafers and chips may include control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its front side and backside. By way of example, the source electrode and gate electrode of a power MOSFET may be situated on one main surface, while the drain electrode of the power MOSFET may be arranged on the other main surface. Furthermore, the devices described below may include integrated circuits to control the integrated circuits of other semiconductor chips, for example the integrated circuits of power semiconductor chips. The semiconductor chips described herein may be manufactured from any specific semiconductor material, for example Si, SiC, SiGe, GaAs, etc., and, furthermore, may contain inorganic and/or organic materials that are not semiconductors, such as for example insulators, plastics or metals.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is a redistribution layer (RDL). The redistribution layer can be in the form of a multi-layer, in particular a multi-layer including a repeating layer sequence. The redistribution layer can also be in the form of a metallization layer including one or more planes in which metallic or electrically conductive contact areas are provided.

Furthermore the semiconductor chips described below may include contact elements or contact pads on one or more of their outer surfaces wherein the contact elements serve for electrically contacting the semiconductor chips. The contact elements may have the form of lands, i.e., flat contact layers on an outer surface of the semiconductor chip. The metal layer(s) of which the contact elements are made may be manufactured with any desired material composition. Any desired metal or metal alloy, for example aluminum, titanium, gold, silver, copper, palladium, platinum, nickel, chromium or nickel vanadium, may be used as a layer material. The metal layer(s) need not be homogenous or manufactured from just one material, that is to say various compositions and concentrations of the materials contained in the metal layer(s) are possible. The contact elements may be situated on the active main surfaces of the semiconductor chips or on other surfaces of the semiconductor chips.

Carriers described below may include any kind of carriers for supporting a semiconductor chip, in particular carriers made of a conducting material such as e.g., leadframes or TSLP carriers (Thin Small Leadless Package), or carriers made of a non-conductive material such as e.g., PCBs (Printed Circuit Boards), SBU (Sequential Build-Up) laminate substrates, ceramic substrates, plastic substrates, mold compounds, e.g., MIDs (Molded Interconnect Devices).

Embodiments of manufacturing a substrate having circuit interconnections may include substrates of different type and configuration, in particular substrates made on a basis of epoxy resin such as e.g., PCBs or SBU laminate substrates, substrates made of plastics such as polyethylenterephthalat or polyimid, ceramic substrates, mold compounds, e.g., MIDs, wafers or reconstituted wafers.

Embodiments of manufacturing a semiconductor device or a substrate having circuit interconnections may include forming a metallization layer. The metallization layer may be of any conductive material and, in particularly, any metal material such as e.g., copper, aluminum etc.

The semiconductor chips may become covered with an encapsulating material. The encapsulating material can be any electrically insulating material like, for example, any kind of molding material, any kind of epoxy material, or any kind of resin material or any other kind of dielectric material.

In the claims and in the following description different embodiments of a method of fabricating a semiconductor chip package are described as a particular sequence of processes or measures, in particular in the flow diagrams. It is to be noted that the embodiments should not be limited to the particular sequence described. Particular ones or all of the processes or measures can also be conducted simultaneously or in any other useful and appropriate sequence.

Referring to FIG. 1, there is illustrated a flow diagram of a method of fabricating a semiconductor device according to one embodiment. The method includes providing at least one semiconductor chip including an electrically conductive layer (s1), applying a voltage to an electrode (s2), and moving the electrode over the electrically conductive layer for growing a metal layer onto the electrically conductive layer (s3).

According to one embodiment, the method of FIG. 1 further includes rolling the electrode over the electrically conductive layer. In this embodiment the moving of the electrode is performed by rolling the electrode. The rolling can be performed such that an electrode is provided which has the form of a roll and is hold in a stationary position rotating about a stationary axis and the semiconductor chip with the electrically conductive layer is linearly moved during contacting a circumferential point of the resulting in a rolling movement of the electrode over the layer as will be illustrated in further detail below.

According to one embodiment of the method of FIG. 1, the semiconductor chip includes at least one contact element or contact pad at one or more of its outer surfaces. The electrically conductive layer can at least in principle be identical with this contact pad. According to one embodiment the electrically conductive layer will be fabricated by forming one or more layers onto or above the contact element which also will be explained in further detail below.

According to one embodiment of the method of FIG. 1, the electrically conductive layer is fabricated by one of sputtering and ink-jet printing. According to an embodiment thereof, the electrically conductive layer is fabricated onto or above a contact element or contact pad of the semiconductor chip.

According to one embodiment, the method of FIG. 1 further includes applying a metal ion containing solution to the electrically conductive layer. The metal ion containing solution can be an electrolytic solution as, for example, a copper sulfate solution.

According to one embodiment, the method of FIG. 1 further includes positioning a further electrode in a distance from the electrically conductive layer. According to a further embodiment thereof, the moving electrode can be a cathode electrode wherein the further electrode can be an anode electrode. According to a further embodiment thereof, the further electrode can have the form of a roll wherein the roll is stationary and not in a moving or rolling condition during operation.

According to one embodiment, the method of FIG. 1 further includes placing the semiconductor chip onto a carrier. The carrier can be a leadframe, in one embodiment a special leadframe including an elevation an upper surface of which is intended to lie within one and the same plane as the electrically conductive layer.

According to one embodiment the method of FIG. 1, further includes applying an encapsulant material onto the semiconductor chip. According to one embodiment thereof, the encapsulant material can be applied such that an upper surface of the encapsulation layer and an upper surface of the electrically conductive layer come to lay within one and the same plane.

According to one embodiment of the method of FIG. 1, the metal layer is grown as a planar layer.

According to one embodiment of the method of FIG. 1, the method further includes providing a semiconductor chip including two or more electrically conductive layers, and growing a metal layer onto each one of the electrically conductive layers such that the metal layers are planar layers situated in a common plane. According to one embodiment thereof, the electrically conductive layers are identical with or electrically connected with contact elements or contact pads of the semiconductor chip. In particular, the contact elements or contact pads can be source and gate electrodes of a vertical field effect transistor.

According to one embodiment of the method of FIG. 1, the metal layer is grown as a non-planar layer. According to one embodiment thereof, the metal layer forms an electrical connection between the electrically conductive layer and a terminal of a leadframe.

Referring to FIGS. 2A-C, there are illustrated schematic cross-sectional representations for illustrating an embodiment of the method of FIG. 1. FIG. 2A illustrates a semiconductor chip 1 including an electrically conductive layer 1A. FIG. 2B illustrates the semiconductor chip 1 together with an electrode 2 wherein a voltage is applied to the electrode 2. The electrode 2 can have the form of a roll. FIG. 2C illustrates the process of moving the electrode 2 over the electrically conductive layer 1A for growing a metal layer 3 onto the electrically conductive layer 1A. It is illustrated that the moving of the electrode 2 can be a rolling of the electrode 2 over the electrically conductive layer 1A. The rolling of the electrode 2 can be effected by contacting the electrode 2 with the electrically conductive layer 1A and linearly or translationally moving the semiconductor chip 1 in a particular direction such as a direction to the right as illustrated by the arrow on the right side in FIG. 2C effecting a clock-wise rotation of the electrode 2.

Referring to FIG. 3, there is illustrated a flow diagram of a method of fabricating a semiconductor device according to one embodiment. The method includes providing at least one semiconductor chip including an electrically conductive layer (s1) and growing a metal layer onto the electrically conductive layer by galvanic roll-plating (s2).

Further embodiments of the method of FIG. 3 can be provided according to the embodiments as described above in connection with the method of FIG. 1.

Referring to FIG. 4, there is illustrated a flow diagram of a method of fabricating a semiconductor device according to one embodiment. The method includes providing at least one semiconductor chip including an electrically conductive layer (s1), and growing a metal layer onto the electrically conductive layer by galvanic roll-plating (s2) including applying a voltage to a first electrode (s2.1), positioning a second electrode in a distance to the electrically conductive layer (s2.2), applying a metal ion containing solution to the electrically conductive layer (s2.3), and rolling the first electrode over the electrically conductive layer (s2.4).

According to one embodiment of the method of FIG. 4, the semiconductor chip includes at least one contact element, and the electrically conductive layer is fabricated above the contact element. According to one embodiment thereof, an intermediate metallic layer like, for example, a metal bump can be applied onto the contact element and the electrically conductive layer is fabricated onto the intermediate metallic layer.

According to one embodiment of the method of FIG. 4, the method further includes placing the semiconductor chip onto a carrier. According to one embodiment thereof, the carrier is formed by a leadframe.

Further embodiments can be provided according to the embodiments as were described in connection with the embodiments of above FIGS. 1 to 3.

Referring to FIGS. 5A-E, there are illustrated schematic cross-sectional representations for illustrating one embodiment of the method of FIG. 4. FIG. 5A illustrates a semiconductor chip 1 including an electrically conductive layer 1A. FIG. 5B illustrates the semiconductor chip 1 together with a first electrode 2 which can have the form of a roll. FIG. 5C illustrates the semiconductor chip 1, the first electrode 2 and a second electrode 4 in a distance to the electrically conductive layer 1A. FIG. 5D illustrates the applying of a metal ion containing solution 5 to the electrically conductive layer 1A. FIG. 5E illustrates the rolling of the first electrode 2 over the electrically conductive layer 1A resulting in the growth of a metal layer 3 onto the electrically conductive layer 1A.

Referring to FIGS. 6A-E, there are illustrated schematic cross-sectional representations for illustrating one embodiment of manufacturing a semiconductor device 200. According to FIG. 6A, a carrier having a flat base part 202a and an integral elevated contact part 202b projecting from the base part 202a is provided. The carrier may be a metal carrier, e.g., a leadframe 202. The base part 202a may e.g., have a thickness of about 150 µm to 280 µm. The elevated contact part 202b may e.g., have a height of about 50 µm to 200 µm over the upper surface of the base part 202a.

As illustrated in FIG. 6B, a semiconductor chip 201 is mounted on the base part 202a of the leadframe 202. The semiconductor chip 201 may e.g., be a power semiconductor transistor chip having a vertical structure. In this case, a drain contact 201a of the semiconductor chip 201 may be arranged at the bottom face of the semiconductor chip 201 and a source contact 201b as well as a gate contact 201c of the semiconductor chip 201 may be arranged at the top face of the semiconductor chip 201. The drain contact 201a may be fixed to the base part 202a of the leadframe 202 by soldering, e.g., diffusion soldering, conductive adhesive bonding or other technologies available in the art. The source and gate contacts 201b, 201c may be implemented by contact bumps including one or more metal layers and having a height of e.g., about 5 µm or 20 µm above the top face of the semiconductor chip 201. By way of example, the contact bumps may be made of a first lower layer of gold and a second upper layer of nickel. The level of the upper surface of the source and gate metal bumps may be equal to the level of the upper surface of the elevated contact part 202b. The above description may also be applied to bipolar transistor chips having a collector electrode, an emitter electrode and a base electrode instead of a drain electrode, a source electrode and a gate electrode, respectively.

In a following process, the semiconductor chip 201 may be encapsulated in an insulating polymer encapsulating material 210. The encapsulating material may be made of a dielectric material, on the basis of epoxy. The encapsulating material 210 may be applied by a dispensing, printing, immersion or molding process. A spin-on method may be used to distribute a dispensed liquid encapsulating material 210. Hardening of the encapsulating material 210 could be accomplished by a curing process. In particular, if a molding process is used, the technique of compression molding may be applied for encapsulation. The encapsulating material 210 may be filled by specific filler materials which may be added to the polymer material and could be used to control the physical characteristics of the encapsulating material 210 after hardening. Specially, the CTE (Coefficient of Thermal Expansion) could be controlled by the content of filler material in order to prevent chip damage or chip delamination during temperature cycles.

As illustrated in FIG. 6C, the semiconductor chip 201 may be completely embedded within the encapsulating material 210 except that the upper surfaces of the source and gate bumps 201b, 201c remain exposed. Further, the upper surface of the elevated contact part 202b of the leadframe 202 may remain exposed.

As illustrated in FIG. 6D, a structured layer 207 is generated above the metal bump of the source contact 201b, the metal bump of the gate contact 201c and the elevated contact part 202b of the leadframe 202. The structured layer 207 is intended to be used as a seed layer for the subsequent metallization process, i.e., the galvanic rolling metallization process. The structured layer 207 consists of an electrically conductive material like a metal, a metal alloy or conductive ink and it can be fabricated by different processes as, for example, sputtering or conductive ink-jet printing.

As illustrated in FIG. 6E, a galvanic rolling process is carried out in order to form a structured plated metal layer 208. More specifically, the leadframe with the embedded semiconductor chip 201 may be immersed in an electrolyte 209 which can be, for example, a copper sulfate solution. In addition a first electrode, namely a roll-shaped cathode 211, and a second electrode, namely an anode 212, are also immersed in the electrolyte 209. The anode 212 can include or consist of, for example, elementary copper or a copper alloy to allow in combination with the copper sulfate electrolytic solution the plating of copper layers onto the portions of the structured layer 207. A voltage is applied between the cathode 211 and the anode 212 and the leadframe 202 is linearly moved as illustrated by the arrow under the cathode 211 so that the portions of the structured layer 207 come into contact with a lower circumferential section of the cathode 211 resulting in a clock-wise rotation of the cathode 211 and a rolling of the cathode 211 over the portions of the structured layer 207. In this way, electro-plated copper accumulates on the structured layer 207 to form a structured plated metal layer 208.

The thickness of the structured plated metal layer 208 may vary over a wide range depending on the application under consideration. For instance, a thickness of 2 µm to 10 µm may be appropriate for routing control signals such as signals fed to the gate or base of the transistor. On the other hand, the thickness of the structured plated metal layer 208 may be greater than 50 µm or even be greater than 100 µm or 150 µm, especially if drain (collector) or source (emitter) contacts of power transistors have to be fabricated. The process speed of the linearly moved leadframe 202 can be, for example, in the range of 3-5 m/min. It is also possible and useful to provide a plurality of roll-shaped cathodes 211 arranged in a linear row which will be illustrated in the next figure. The leadframe 202 can be in itself in the form of an endless tape including a plurality of semiconductor chips 201 attached thereon and embedded in a dielectric layer 210, wherein the endless leadframe 202 can be fed into the electrolytic bath and rolled over by each one of the plurality of cathodes 211. After being output out of the electrolytic bath, single semiconductor devices 200 as illustrated in the lower part of FIG. 6E may be obtained by dicing the continuous endless leadframe 202 and the encapsulating material 210. Alternatively, it is also possible not to use a continuous endless leadframe 202 from the beginning but instead attach single leadframe portions such as those illustrated in each one of FIGS. 6A-E and attach those single leadframe portions to a flexible tape which is to be fed through the galvanic roll-plating arrangement.

Referring to FIGS. 7A-D there are illustrated cross-sectional representations to illustrate a method of manufacturing a semiconductor device 300 according to one embodiment. A carrier 302 may be placed on a temporary carrier 320. The carrier 302 may be made of a conductive material such as e.g., metal and may e.g., be a leadframe. However, other carriers as described above are also possible. If made of a conducting material, the carrier 302 may be provided with trenches 330a and 330b which separate the carrier 302 in electrically disconnected or insular sections 302a, 302b and 302c. A semiconductor chip 301 may be mounted on carrier section 302b. By way of example, the semiconductor chip 301 may be a vertical power semiconductor chip containing a power transistor. In this case, the semiconductor chip 301 may be attached with its bottom (or backside) drain contact (301a) to carrier section 302b.

On its top (or front) side, the semiconductor chip 301 may be equipped with a source contact 301b and a gate contact 301c. Again, the semiconductor chip may have a height of about 50 µm to 200 µm above the upper surface of the carrier section 302b.

Then, a structured insulating layer 340 of dielectric material is deposited on parts of the semiconductor chip 301 and on parts of the carrier 302, cf. FIG. 7B. On the semiconductor chip 301, the dielectric material is deposited such that the chip contacts 301b and 301c remain exposed. On the other hand, the insulating layer 340 of dielectric material may cover the side faces of the semiconductor chip 301, the upper surface of the carrier section 302b and may fill the trenches 330a and 330b. The dielectric material may be applied by a substantially additive process such as e.g., dispensing or printing. By way of example, printing may be carried out as a stencil print process, a screen print process or an ink-jet printing process. In a stencil print process or a screen print process, the desired position and shape of the dielectric material are mapped to form openings of the stencil or screen through which the liquid dielectric material is applied. In ink-jet printing, an ink-jet nozzle is used to discharge liquid dielectric material to form the insulating layer 340. In both printing and in dispensing processes, the fineness of the printed or dispensed structures may be controlled by properties of the dielectric material (e.g., viscosity) and both these processes allow for generating structures having dimensions of down to a few µm.

As illustrated in FIG. 7C, a structured layer 307 is fabricated which may serve as a seed layer in a successive galvanic roll-plating process. The structured layer 307 includes or consists of an electrically conductive material like a metal, a metal alloy or conductive ink and it can be fabricated by, for example, sputtering or conductive ink-jet processing. A first part 307a of the structured layer 307 connects to carrier section 302c and extends over the insulating layer 340 to connect to chip contact 301b. A second part 307b of the structured layer 307 contacts to the carrier section 302a, extends over the insulating layer 340 and connects to the chip contact 301c.

FIG. 7D illustrates the result after galvanic roll-plating of a structured metal layer 308 onto the structured layer 307 by use of a cathode in an analogous manner as described in connection with FIG. 6E. A first part 308a of the metal layer 308 is arranged to electrically connect the source contact 301b of the semiconductor chip 301 to the carrier section 302c. The carrier section 302a is electrically isolated from carrier section 302b by the dielectric material filling the trench 330a and serves as a source terminal of the semiconductor device 300. A second part 308b of the metal layer 308 is arranged to electrically connect the gate contact 301c of the semiconductor chip 301 to the section 302a of the carrier 302.

The carrier section 302a is electrically isolated from section 302b of the carrier 302 and serves as a gate terminal of the semiconductor device 300. The section 302b of the carrier 302 serves as a drain terminal of the semiconductor device 300.

Again, an array of a plurality of semiconductor devices 300 arranged on interconnected leadframes 302 and on a common temporary carrier 320 may be processed. After the galvanic roll-plating process, semiconductor devices 300 may be separated from each other by appropriate separation techniques (e.g., sawing, laser-dicing, etc.) and the temporary carrier 320 may be removed afterwards. A resulting semiconductor device 300 is illustrated in FIG. 7D.

Referring to FIG. 8, there is illustrated a schematic cross-sectional representation of a galvanic roll-plating arrangement according to one embodiment. A substrate 400 having an electrically conductive layer 401 thereon is fed to the arrangement to fabricate a metal layer onto the electrically conductive layer 401. The electrically conductive layer 401 can, for example, be made of conductive ink. The substrate 400 can have a flexible constitution like, for example, a thin contiguous and endless leadframe or leadframe portions attached to a tape, so that the substrate 400 can be fed through the galvanic roll-plating arrangement in a reel-to-reel-process. A first reel (not illustrated) may serve to feed the substrate 400 into the electrolytic bath to a first cathode and a second reel (not illustrated) may serve to output the substrate 400 out of the electrolytic bath releasing it from a last cathode. The arrangement as illustrated in FIG. 8 can be one modular section of the arrangement containing two cathodes 411A, 411B and one anode 412. The anode 412 is illustrated in schematic form whereas in fact it can also have the form and shape of a roll being located between the two cathodes 411A, 411B within the electrolytic solution 409 whereas the anode 412 does not get into contact with the electrically conductive layer 401 and is not moving or rolling like the two cathodes 411A, 411B. The anode 412 can be made of copper or a copper alloy. The substrate 400 is linearly moved as illustrated by the arrow thereby mechanically contacting the electrically conductive layer 401 with the two cathodes 411A, 411B resulting in a rolling movement of the cathodes 411A, 411B over the electrically conductive layer 401. In this way, a metal layer 408 is fabricated onto the electrically conductive layer 401. The arrangement as illustrated in FIG. 8 can be one modular section of a galvanic roll-plating apparatus, the apparatus including several further modular sections of the same type and arrangement. By utilizing the reel-to-reel-process a first input reel can be arranged to feed the substrate 400 to the first modular section and a second output reel may serve to output the substrate 400

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a semiconductor device, comprising:
    providing at least one semiconductor chip comprising an electrically conductive layer;
    applying a voltage to an electrode; and
    moving the electrode over the electrically conductive layer for growing a metal layer onto the electrically conductive layer; and
    rolling the electrode over the electrically conductive layer.

2. The method according to claim 1, wherein the semiconductor chip comprises:
    at least one contact element; and
    the electrically conductive layer is fabricated above the contact element.

3. The method according to claim 1, wherein the electrically conductive layer is fabricated by one of sputtering and ink jet printing.

4. The method according to claim 1, further comprising:
    applying a metal ion containing solution to the electrically conductive layer.

5. The method according to claim 1, further comprising:
    positioning a further electrode in a distance from the electrically conductive layer.

6. The method according to claim 1, further comprising:
    placing the semiconductor chip onto a carrier.

7. The method according to claim 1, further comprising:
    applying an encapsulate material onto the semiconductor chip.

8. The method according to claim 1, wherein the metal layer is grown as a planar layer.

9. The method according to claim 1, further comprising:
    providing a semiconductor chip comprising two or more electrically conductive layers; and
    growing a metal layer onto each one of the electrically conductive layers such that the metal layers are planar layers situated in a common plane.

10. The method according to claim 1, wherein the metal layer is grown as a non-planar layer.

11. A method of fabricating a semiconductor device, comprising:
    providing at least one semiconductor chip comprising an electrically conductive layer; and
    growing a metal layer onto the electrically conductive layer by galvanic roll plating.

12. The method according to claim 11, further comprising:
    rolling an electrode over the electrically conductive layer.

13. The method according to claim 11, wherein the semiconductor chip comprises at least one contact element and the electrically conductive layer is fabricated onto the contact element.

14. The method according to claim 11, wherein the electrically conductive layer is fabricated by one of sputtering and ink jet printing.

15. The method according to claim 11, further comprising:
    applying a metal ion containing solution to the electrically conductive layer.

16. The method according to claim 11, further comprising:
    positioning an electrode in a distance from the electrically conductive layer.

17. The method according to claim 11, further comprising:
    placing the semiconductor chip onto a carrier.

18. The method according to claim 11, further comprising:
    applying an encapsulate material onto the semiconductor chip.

19. The method according to claim 11, wherein the metal layer is grown as a planar layer.

20. The method according to claim 11, further comprising:
    providing a semiconductor chip comprising two or more electrically conductive layers; and
    growing a metal layer onto each one of the electrically conductive layers such that the metal layers are planar layers situated in a common plane.

21. The method according to claim 11, wherein the metal layer is grown as a non-planar layer.

22. A method of fabricating a semiconductor device, comprising:
provided at least one semiconductor chip comprising an electrically conductive layer; and
growing a metal layer onto the electrically conductive layer by galvanic roll plating, comprising
applying a voltage to a first electrode;
positioning a second electrode in a distance to the electrically conductive layer;
applying a metal ion containing solution to the electrically conductive layer; and
rolling the first electrode over the electrically conductive layer.

23. The method according to claim 22, wherein the semiconductor chip comprises:
at least one contact element; and
the electrically conductive layer is fabricated above the contact element.

24. The method according to claim 22, further comprising:
placing the semiconductor chip onto a carrier.

* * * * *